United States Patent [19]
Hall

[11] Patent Number: 5,936,868
[45] Date of Patent: Aug. 10, 1999

[54] METHOD FOR CONVERTING AN INTEGRATED CIRCUIT DESIGN FOR AN UPGRADED PROCESS

[75] Inventor: David W. Hall, Satellite Beach, Fla.

[73] Assignee: Harris Corporation, Palm Bay, Fla.

[21] Appl. No.: 08/812,805

[22] Filed: Mar. 6, 1997

[51] Int. Cl.⁶ .................................................. G06F 17/50
[52] U.S. Cl. .......................................... 364/491; 364/489
[58] Field of Search ................................. 364/488, 489, 364/490, 491, 578

[56] References Cited

U.S. PATENT DOCUMENTS

| | | | |
|---|---|---|---|
| 4,803,636 | 2/1989 | Nishiyama et al. | 364/491 |
| 4,882,690 | 11/1989 | Shinsha et al. | 364/490 |
| 4,967,367 | 10/1990 | Piednoir | 364/489 |
| 5,018,074 | 5/1991 | Griffith et al. | 364/490 |
| 5,079,717 | 1/1992 | Miwa | 364/490 |
| 5,308,798 | 5/1994 | Brasen et al. | 437/250 |
| 5,309,371 | 5/1994 | Shikata et al. | 364/491 |
| 5,369,596 | 11/1994 | Tokumaru | 364/491 |
| 5,416,722 | 5/1995 | Edwards | 364/491 |
| 5,461,577 | 10/1995 | Shaw et al. | 364/491 |
| 5,493,509 | 2/1996 | Matsumoto et al. | 364/491 |
| 5,517,421 | 5/1996 | Jimbo et al. | 364/491 |
| 5,526,278 | 6/1996 | Powell | 364/489 |
| 5,537,648 | 7/1996 | Liebmann et al. | 395/500 |
| 5,553,274 | 9/1996 | Liebermann | 395/500 |
| 5,581,475 | 12/1996 | Majors | 364/491 |
| 5,598,348 | 1/1997 | Rusu et al. | 364/491 |
| 5,610,831 | 3/1997 | Matsumoto | 364/491 |
| 5,612,893 | 3/1997 | Hao et al. | 364/491 |
| 5,745,374 | 4/1998 | Matsumoto | 364/491 |
| 5,754,826 | 5/1998 | Gamal et al. | 395/500 |

*Primary Examiner*—Kevin J. Teska
*Assistant Examiner*—Leigh Marie Garbowski
*Attorney, Agent, or Firm*—Allen, Dyer, Doppelt, Milbrath & Gilchrist, P.A.

[57] ABSTRACT

A method for converting an original integrated circuit (IC) design to an updated IC design for an updated manufacturing process includes accessing a mask database for the original IC design and manipulating the data by various scaling steps and other modifications. The original IC design may include contacts so the method includes the steps of performing a first downward size scaling on the mask data to scale down the original IC design, and selectively performing a second downward size scaling on the mask data to further scale down the contacts. The step of selectively performing the second downward size scaling may preferably include the steps of displaying and viewing an image of the IC design to aid in selection. The vias of the IC design may also be scaled downward. The method may also further include the step of selectively performing a downward size scaling on the mask data in at least one dimension to further scale down a size of the polysilicon gates. The method may further include the steps of selectively performing an upward size scaling on the mask data to scale up the power supply rails, and selectively performing an upward size scaling on the mask data to scale up the bond pads. The original test and alignment structures are preferably replaced by new test structures and alignment keys for the updated process, and new ESD protection may be substituted for the original ESD protection.

55 Claims, 7 Drawing Sheets

METHOD FOR CONVERTING AN INTEGRATED CIRCUIT DESIGN FOR AN UPGRADED PROCESS

FIELD OF THE INVENTION

The present invention relates to a method for designing integrated circuits, and, more particularly, to a method for converting an integrated circuit design for an upgraded manufacturing process.

BACKGROUND OF THE INVENTION

Integrated circuits (ICs) are widely used in virtually all electronic devices. Unfortunately, a given IC may have a sales lifetime in excess of ten years, while the manufacturing life of the IC is only about five years. A typical semiconductor manufacturing facility upgrades its fabrication lines to accommodate more advanced processes. For example, the ability to run larger wafers containing higher device densities may generate more revenue. Economics typically mean that a semiconductor manufacturer can recover upgrade costs more quickly by manufacturing the densest integrated circuits using the newest processes. Although older integrated circuits will often still be manufacturable on the upgraded line, the revenue generated will be less than that generated by higher density designs using the upgraded processes. Accordingly, certain older integrated circuits may become unavailable. Unfortunately, the unavailability of a single IC that is part of an overall electronic system may render the system difficult or impossible to manufacture until a replacement for the IC is developed.

There are several conventional approaches for developing and producing a replacement IC compatible with a newer semiconductor manufacturing process. One is to simply totally redesign the IC, and which may result in a superior IC. Unfortunately, a total redesign is a long process and may be relatively expensive.

Another approach is a manual redesign wherein the logic is moved from one library to another. This can be a time consuming task and the target library may not contain all of the logic functions used in the predecessor library. Moreover, the decisions made in the manual redesign relating to timing of altered logic may be incorrect, thereby introducing errors in the design. In addition, even if the target library includes matching cells, their delays will not necessarily ratio uniformly. Accordingly, exhaustive simulations may be required to ensure that the new part is acceptable. If security fault analysis (SFA) or certification is needed, the time period may be even further extended before the part is available.

Another approach is known as Netlist conversion using Computer Aided Engineering (CAE) software which is typically relatively expensive. Netlist conversion assumes that all cells used in the obsolete design are present in the target process. Netlist conversion may be more reliable than manual conversion; however, the new IC will have a different layout. The layout changes may result in logic elements being placed differently and interconnects being routed differently. Simulations need to be thorough and exhaustive to insure the new part will not cause failures when used in the system.

If the obsolete design is in VHSIC Hardware Description Language (VHDL) format, for example, the conversion may be easier. VHDL, and its associated support software permit easier simulations. Logic elements and interconnects are changed from the obsolete part and, should SFA or certification be required, the time before the new IC can be used will be extended.

U.S. Pat. No. 5,018,074 Griffith et al. discloses a method for making gate array masks in which a mask set for an existing set of gate array cells is converted to follow new design rules requiring non-uniform transformation of circuit components. The background of the invention provides that as fabrication processes are continually being improved to reduce geometry sizes, enhance device properties and lower productions costs, that many changes cannot be made to all components of the circuit. The patent takes advantage that for gate array cells, as compared to custom circuits, the masks/layout geometries differ only on the interconnect layers and the metal interconnect layers. All other layers, for example, field implant, diffusion and polysilicon are the same for every gate array cell.

Along these lines, U.S. Pat. No. 5,079,717 to Miwa also discloses a method for making a mask with pattern data which have been compaction processed, and wherein each level of a cell remains interconnected. Also relating to compaction, U.S. Pat. No. 5,493,509 to Matsumoto et al. discloses in its background section that compaction or spacing techniques involve shortening the distance between symbols as design rules permit to produce a high packing density layout. Compaction can be two-dimensional compaction, or one dimensional compaction where components are moved first in the x-direction and then in the y-direction. The one dimensional compaction may be a shear line method, a virtual grid method, and a constraint graph method, with the constraint graph method identified as the most widely used.

U.S. Pat. No. 5,416,722 to Edwards discloses computer aided design for compacting semiconductor circuit layouts to meet a specified set of design rules. The automated circuit layout compaction process begins by fracturing a specified circuit layout into a maximal set of trapezoids and then storing the resulting trapezoids in a connectivity data structure that denotes boundaries of each cell, and the cell adjacent to each boundary.

U.S. Pat. No. 4,803,636 to Nishiyama et al. discloses a circuit translator for logic circuits for automatically translating a logic circuit using a first type of technology, for example, CMOS to a logic circuit using a second type of device, for example I$^2$L. An input circuit inputs the elements of the circuit to be translated, a memory stores circuit translating rules, a group of optimizing rules, and a program for processing the translation, and an output device produces an intermediate result, such as on a graphic display. As noted, the translation rules become complex and large in number. A Boolean operation is described for translation rules in the same circuit technology.

U.S. Pat. No. 4,882,690 to Shinsha et al. discloses synthesizing an updated gate-level logic circuit which performs updated functions of current functions which, in turn, are performed by a current gate-level logic circuit so that a part is used in the updated circuit. The current circuit may include a modification to an original gate-level logic circuit synthesized by a computer for performing the current functions.

U.S. Pat. No. 5,553,274 to Liebmann discloses optical proximity correction for enhancing the fidelity of VLSI pattern transfer operations, and wherein a series of shrink, expand and subtraction operations are employed to fracture CAD pattern data into basic rectangles abutting at vertices in the original design. The thus defined rectangles are then classified as to their functional relevance based on their spatial relation to prior or subsequent CAD design levels. By shifting the edges of only the basic rectangles deemed relevant for improvement of the VLSI device performance, the generation of new vertices is minimized and effort is expended only on high value add portions of the circuit design.

Also relating to CAD tools for integrated circuit layout design, U.S. Pat. No. 5,461,577 to Shaw et al. discloses random logic circuitry laid out in a logic array that has a plurality of row and column locations. U.S. Pat. No. 5,517,421 to Jimbo et al. discloses a integrated circuit layout method wherein part data are revised along with the progress in semiconductor processes. When the content of one part or one element is updated to a new version, the influence of this update to a new version is readily determined based on the process data so that updating to a new version of the other parts can also be easily conducted based on the process data.

U.S. Pat. No. 5,308,798 to Brasen et al. also discloses computer aided design for integrated circuit layout. Similarly, U.S. Pat. No. 5,369,596 to Tokumaru discloses a computer aided design process also employing compaction. U.S. Pat. No. 5,537,648 to Liebmann et al. discloses a CAD system for generating phase shifted mask designs. U.S. Pat. No. 5,526,278 to Powell discloses a method and apparatus for converting field-programmable logic cell implementations into mask-programmable logic cell implementations, or into mask-programmable standard cell implementations. Unfortunately, specialized computer software can be relatively expensive and may not be suitable for a wide range of applications, particularly where it is desired to avoid the need for extensive testing or certification.

SUMMARY OF THE INVENTION

In view of the foregoing background, it is therefore an object of the present invention to provide a method for converting an original IC design for an original manufacturing process to an updated IC design for an updated manufacturing process without requiring the use of expensive software, and without requiring extensive testing or certification.

These and other objects, features and advantages in accordance with the present invention are provided by a method for converting an original IC design for an original manufacturing process to an updated IC design for an updated manufacturing process by accessing a database comprising mask data for the original IC design and manipulating the data by various scaling steps and other modifications. After the modifications, the updated mask data is stored for the updated IC design to be manufactured using the updated process. In one embodiment, the original IC design comprises contacts. Accordingly, for this embodiment the method comprises the steps of performing a first downward size scaling on the mask data to scale down the original IC design; and selectively performing a second downward size scaling on the mask data to further scale down the contacts.

The step of selectively performing the second downward size scaling may preferably comprise the steps of: displaying and viewing an image of the IC design, and selecting the contacts based on displaying and viewing the image. Alternatively, the contacts may be identified in the database, and the contacts may be selected based upon the database information. The steps of performing the first downward size scaling and the selectively performing the second downward size scaling are each preferably performed in two dimensions. Moreover, each contact preferably defines a respective center point, and the step of selectively performing the second downward size scaling preferably comprises selectively performing same while maintaining the respective center point of each contact.

The step of performing the first downward size scaling preferably comprises performing same by a first factor. The step of selectively performing the second downward scaling preferably comprises performing same by a second factor different from the first factor. Prior to the first downward size scaling, the method preferably includes the steps of displaying and viewing an image of the IC design, and correcting errors determined based on viewing the image.

In another embodiment, the original IC design includes vias. Thus, the method may further include selectively performing a third downward size scaling on the mask data to further downwardly scale the vias for the new or updated process. The vias may be selected based on displaying and viewing an image of the IC design.

In yet another embodiment, the original IC design includes at least one elongate contact. The method thus preferably further comprises the step of selectively performing a division of the at least one elongate contact on the mask data into a plurality of generally square contacts. The step of selectively performing the division may include displaying and viewing an image of the IC design, and selecting the at least one elongate contact based on displaying and viewing the image. In addition, the method may preferably further comprise the step of adding a connector to the mask data to connect the plurality of generally square contacts.

Another aspect of the invention relates to the polysilicon gates of MOS devices. More particularly, the method preferably further comprises the step of selectively performing a fourth downward size scaling on the mask data in at least one dimension to further scale down a size of the polysilicon gates. Since it is typical for the mask data of the original IC design to identify active areas and polysilicon areas, the step of selectively performing the forth downward size scaling may include selecting the polysilicon gates based upon the mask data identifying an area that is both an active area and a polysilicon area.

Yet another important aspect of the invention relates to the treatment of the supply rails. In other words, the method may further comprise the step of selectively performing a fifth upward size scaling on the mask data in at least one dimension to scale up at least one of the power supply rails. The step of selectively performing the fifth upward scaling preferably comprises displaying and viewing an image of the IC design, and selecting the power supply rails based on displaying and viewing the image. Moreover, the step of the fourth upward size scaling for the power supply rails preferably comprises the step of determining a scaling factor based on a desired voltage noise ratio between the original process and the updated process.

In another embodiment relating to the treatment of the supply rails, the method includes determining a desired width upward scaling factor based on a desired voltage noise ratio between the original process and the updated process, and selectively adding at least one additional parallel supply rail based upon determining that the desired width upward scaling factor is greater than about two.

In many embodiments, the original IC comprises bond pads. Accordingly, the method preferably further comprises the step of selectively performing a sixth upward size scaling on the mask data to scale up the bond pads. The step of selectively performing the sixth upward scaling preferably comprises displaying and viewing an image of the IC design during selecting.

In addition, the step of selectively performing the sixth upward size scaling may preferably include performing same while avoiding intrusion into adjacent circuit portions.

The original IC design may comprise original test structures and alignment keys. In accordance with this aspect of the method, these original test and alignment structures are replaced by new test structures and alignment keys for the updated process. Similarly, where the original IC design comprises original electrostatic discharge (ESD) protection, the method preferably further includes the step of substituting new ESD protection for the original ESD protection. Of course, if desired the method may also comprise the step of running simulations for circuit delays.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The invention involves mask conversion using the original IC mask database and may work best with cell library designs. The database is operated on directly and takes advantage of the tighter design rules available in the upgraded manufacturing process. The resulting upgraded IC will have the same cells and the same adjacent interconnects, which may result in relief to SFA and certification requirements. The original mask database may be operated upon using conventional CAE software that is capable of reading and writing in the database's original format as would be readily understood by those skilled in the art. The software may also be capable of performing scaling, shrinking, repositioning, and Boolean operations as would be readily understood by those skilled in the art.

The mask conversion may be better understood with the following example description for conversion from CMOSN (a 1.2 $\mu$m process) to CMOSX (a 0.8 $\mu$m and 0.5 $\mu$m process). CMOSN is a cell library used for certain government applications, and is a mature process. Although the following illustrated example is specific for a CMOSN to CMOSX conversion, the steps are similar when converting between other CMOS processes as will be appreciated by those skilled in the art. Only the scaling and shrink constants, the polysilicon adjustment quantification, and the magnitude of the sizing adjustments to power and ground rails may differ.

Figures 1A, 1B, 1C:
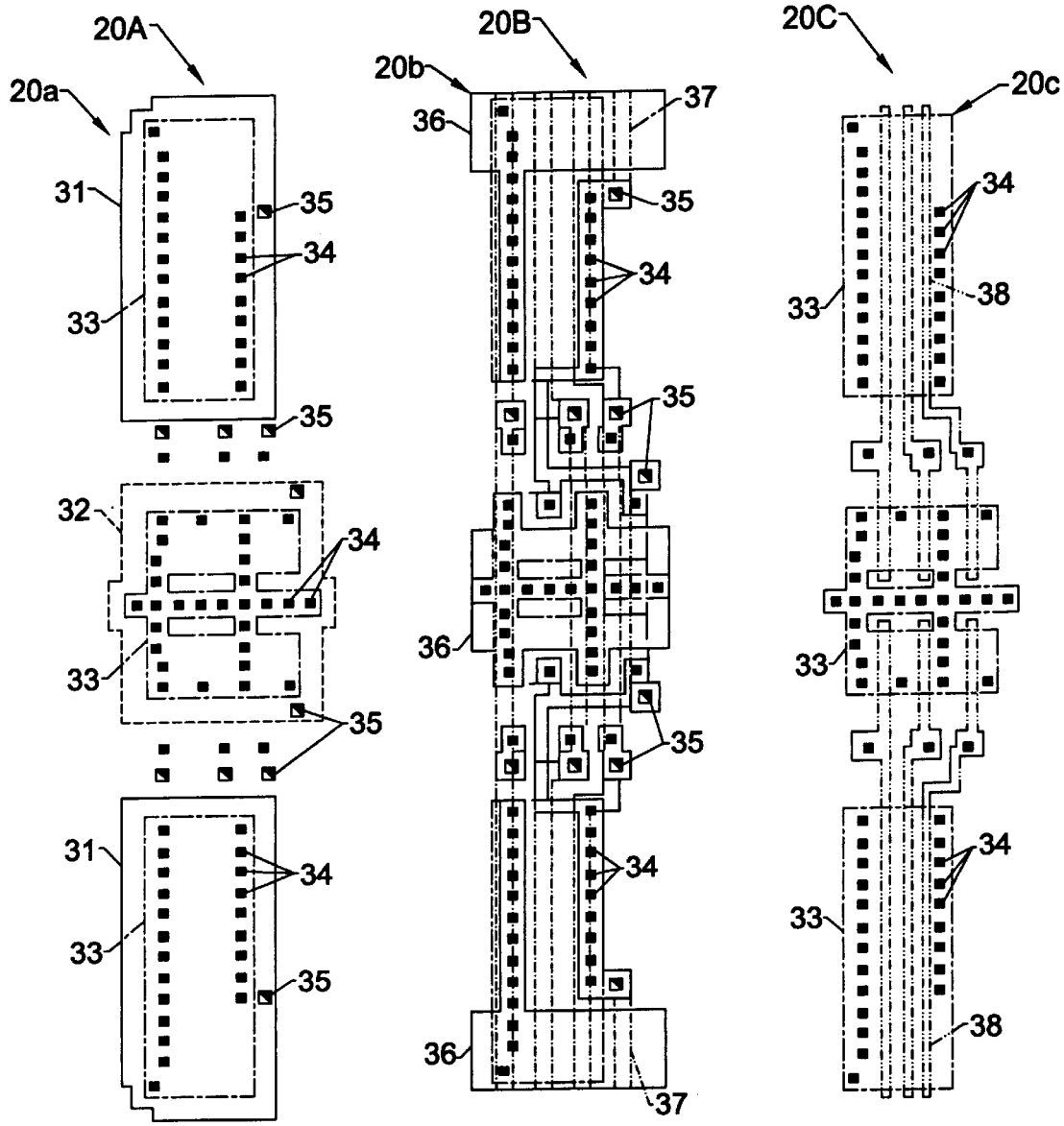
FIG. 1A is a top plan view of an original IC cell design showing for clarity only the active areas, N-well, P-well, contacts, and vias used in accordance with the present invention.
FIG. 1B is a top plan view of the original IC cell design showing for clarity only the active areas, first and second metal layers, contacts, and vias used in accordance with the present invention.
FIG. 1C is a top plan view of the original IC cell design showing for clarity only the active areas, polysilicon, and contacts used in accordance with the present invention.

The original database information is loaded onto an appropriate CAE platform, and a first visual inspection is made of the original cell design 20A, 20B, and 20C for gross errors. The original cell is shown in FIGS. 1A, 1B and 1C as portions 20A, 20B and 20C for clarity of explanation. In these and figures FIGS. 2A to 6C, the heavy solid line in the "A" figures represent the N-well 31, the dashed line represents the P-well 32, and the active areas 33 are represented by short and long alternating dashed lines. In all the figures, the solid squares represent contacts 34, and the squares with the diagonal shade represent vias 35. In the "B" figures, the light solid line represents a first metal layer 36, and the dot and dash line represents the second metal layer 37. Lastly, particularly for the "C" figures polysilicon 38 is represented by the double dot and dashed line.

Figure 2A:
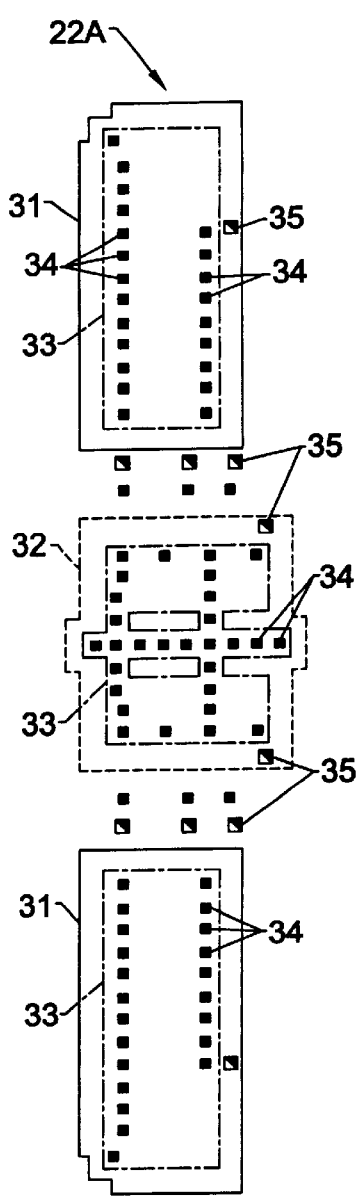
FIG. 2A is a top plan view of the IC cell design after a first step in accordance with the invention and showing for clarity only the active areas, N-well, P-well, contacts, and vias.
Figure 2B:
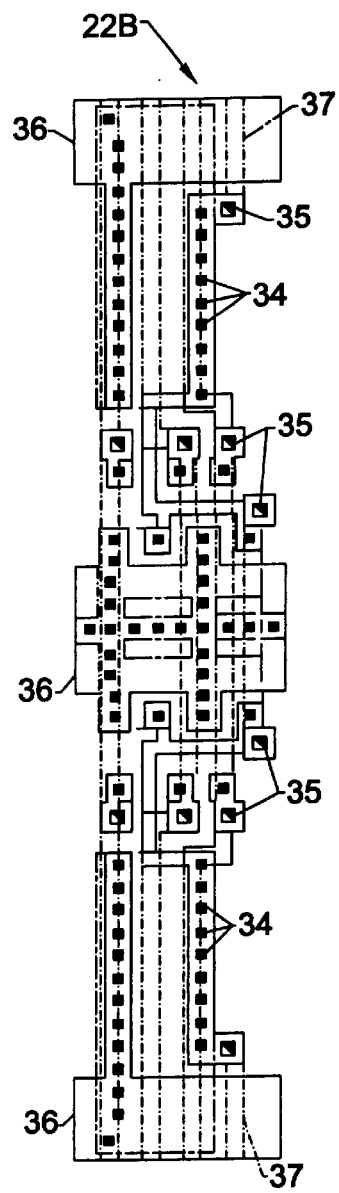
FIG. 2B is a top plan view of the IC cell design after a first step in accordance with the invention and showing for clarity only the active areas, first and second metal layers, contacts, and vias.
Figure 2C:
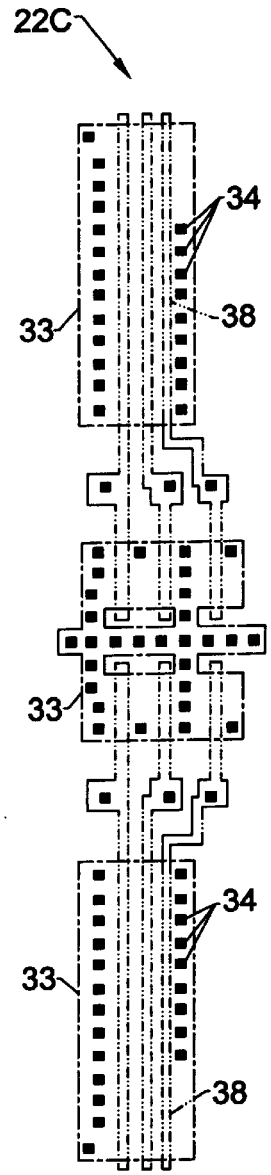
FIG. 2C is a top plan view of the IC cell design after a first step in accordance with the invention and showing for clarity only the active areas, polysilicon, and contacts.
Figure 3A:
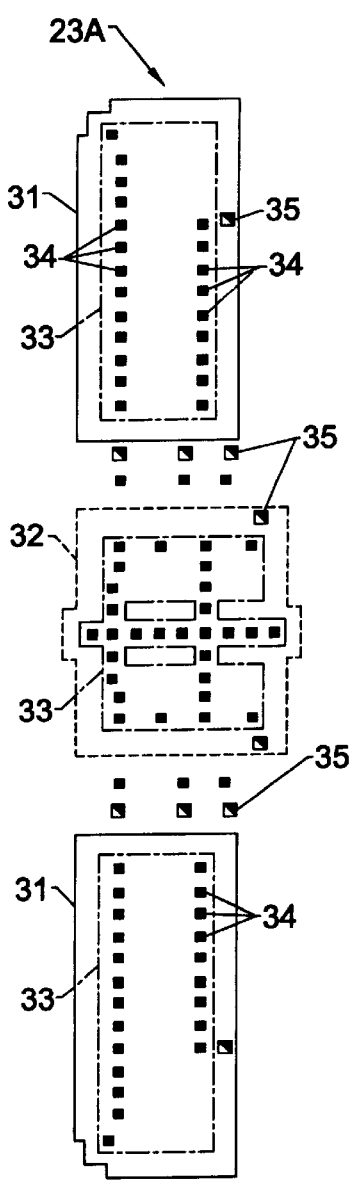
FIG. 3A is a top plan view of the IC cell design after a second step in accordance with the invention and showing for clarity only the active areas, N-well, P-well, contacts, and vias.
Figure 3B:
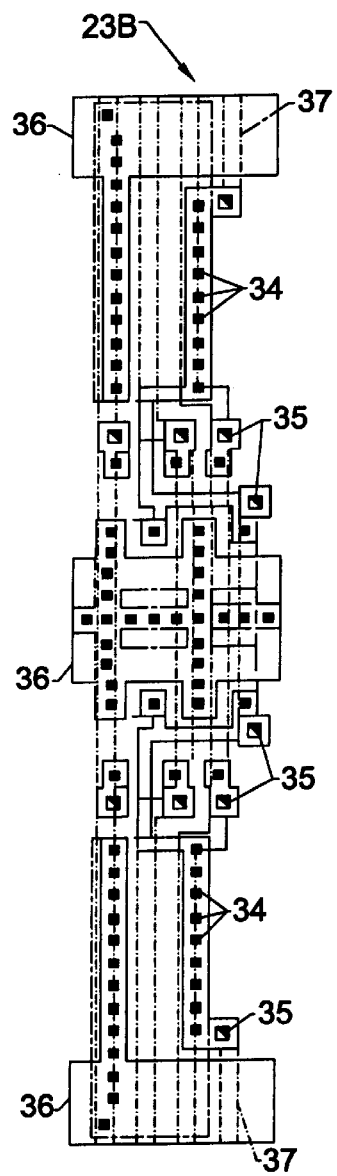
FIG. 3B is a top plan view of the IC cell design after a second step in accordance with the invention and showing for clarity only the active areas, first and second metal layers, contacts, and vias.
Figure 3C:
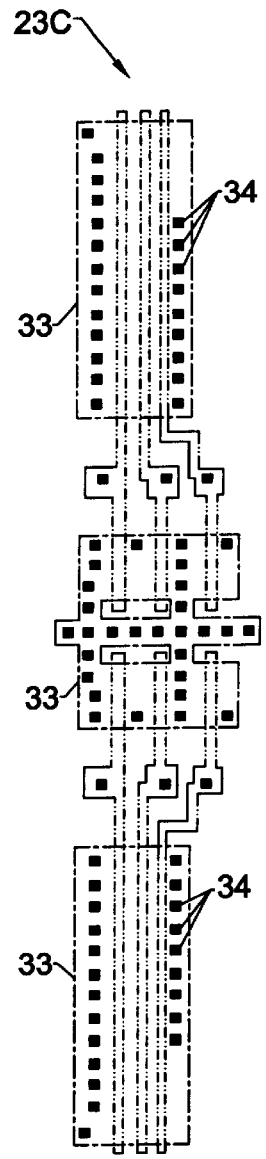
FIG. 3C is a top plan view of the IC cell design after a second step in accordance with the invention and showing for clarity only the active areas, polysilicon, and contacts.

The original cell 20A, 20B and 20C (FIGS. 1A, 1B and 1C, respectively) is first scaled downward by a predetermined factor, such as 0.8 to produce the cell 22A, 22B and 22C (FIGS. 2A, 2B and 2C, respectively). The contacts 34 and vias 35 of the upgraded process may be desirably smaller than those produced by the scaling operation. For example, the scaled contacts 34 may be 0.96 μm on a side, while the desired size is 0.8 μm on a side. In addition, the vias 35 after scaling may be too large, e.g., 1.44 μm on a side, and should be 0.8 μm in the new process. Accordingly, both the contacts and vias are selected and shrunken down to the desired size as shown by the cell 23A, 23B and 23C in FIGS. 3A, 3B and 3C, respectively. These steps may be performed individually or separately, especially when the contacts 34 are identified in the database and can be readily selected based upon the database information. The contacts 34 and vias 35 may also be scaled in separate steps when different size scaling factors are desired as would be readily understood by those skilled in the art.

Figures 4A, 4B, 4C:
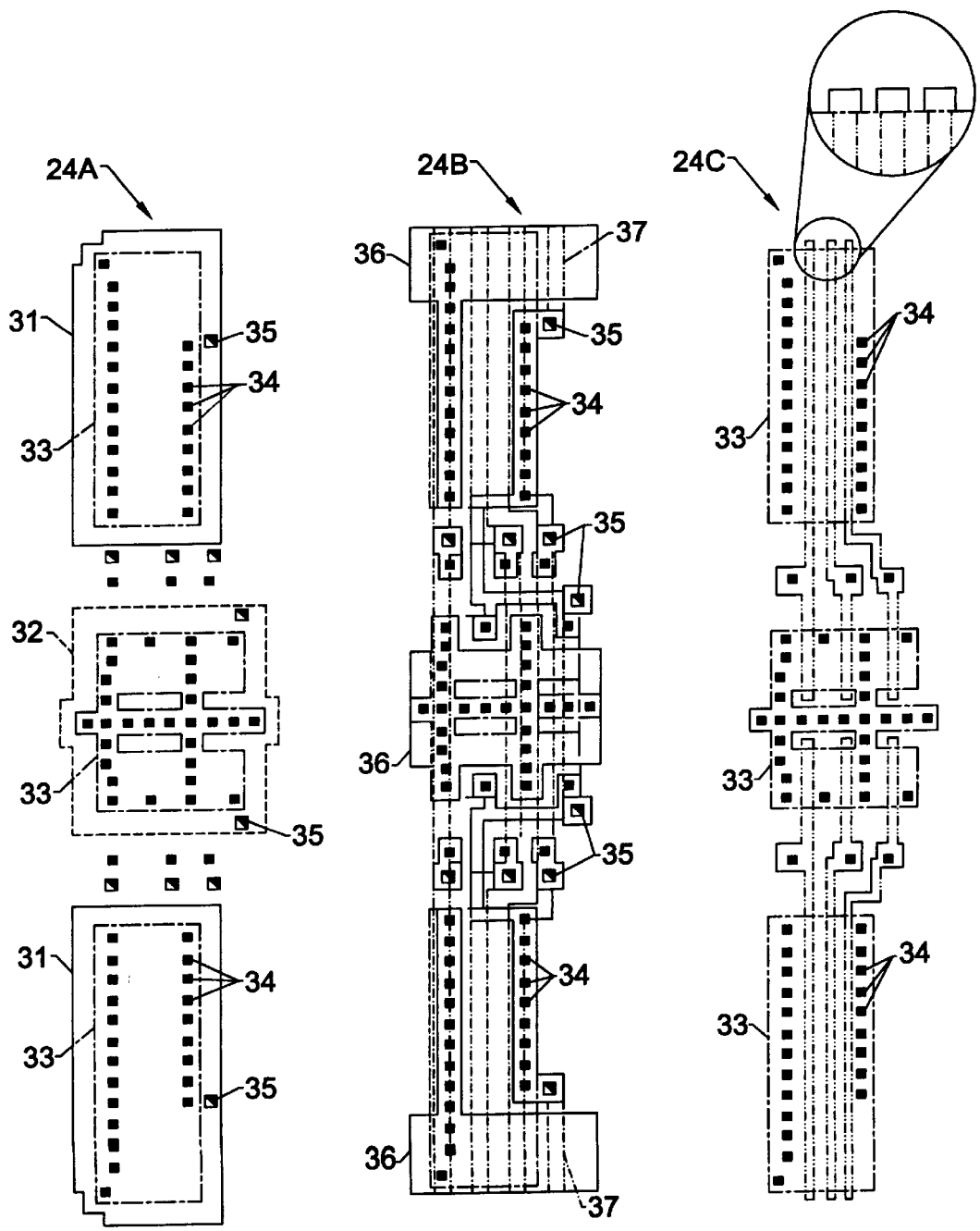
FIG. 4A is a top plan view of the IC cell design after a third step in accordance with the invention and showing for clarity only the active areas, N-well, P-well, contacts, and vias.
FIG. 4B is a top plan view of the IC cell design after a third step in accordance with the invention and showing for clarity only the active areas, first and second metal layers, contacts, and vias.
FIG. 4C is a top plan view of the IC cell design after a third step in accordance with the invention and showing for clarity only the active areas, polysilicon and contacts.
Figure 5A:
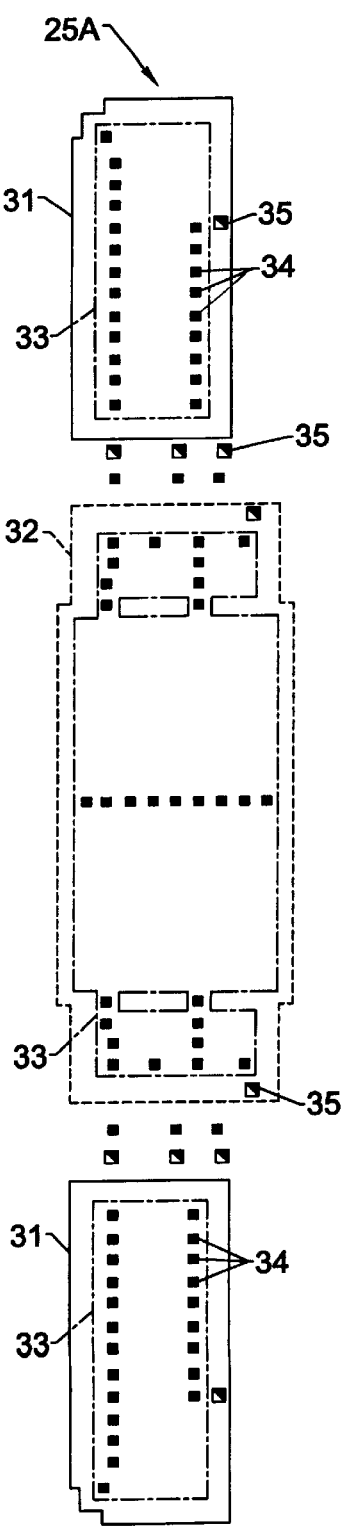
FIG. 5A is a top plan view of the IC cell design after a fourth step in accordance with the invention and showing for clarity only the active areas, N-well, P-well, contacts, and vias.
Figure 5B:
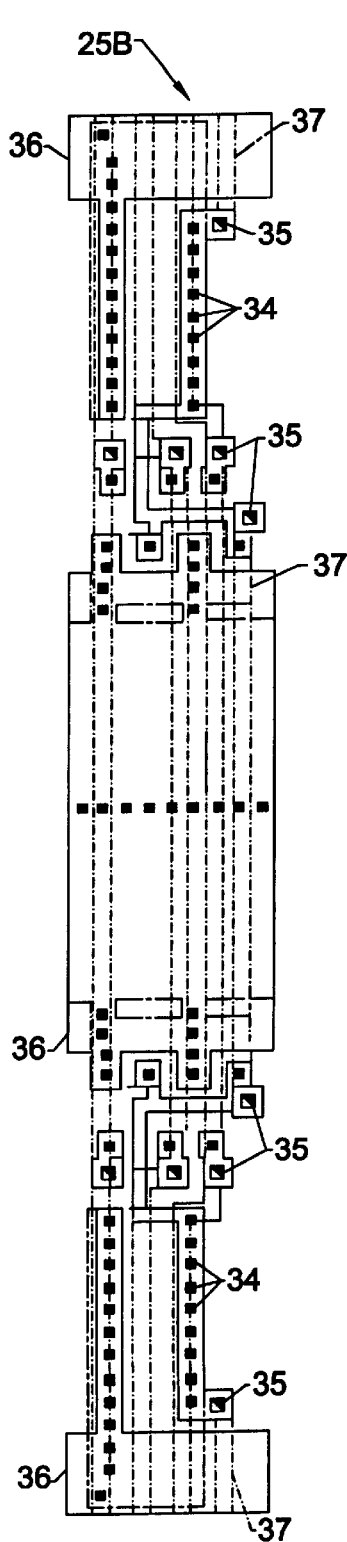
FIG. 5B is a top plan view of the IC cell design after a fourth step in accordance with the invention and showing for clarity only the active areas, first and second metal layers, contacts, and vias.
Figure 5C:
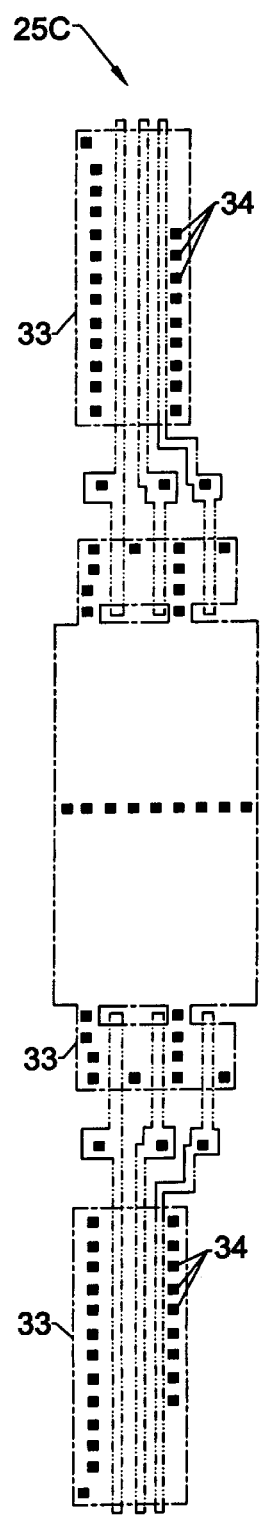
FIG. 5C is a top plan view of the IC cell design after a fourth step in accordance with the invention and showing for clarity only the active areas, polysilicon, and contacts.

Another area that may require additional intervention is the minimum gate polysilicon 38 which defines the minimum (allowed by the fabrication process) channel length of MOS devices. After scaling, the channel length may be 0.96 μm, while the desired gate polysilicon 38 is desirably either 0.8 or 0.5 μm depending on the process variation targeted. To achieve this portion of the conversion, a Boolean function may be used. The polysilicon segments that satisfy the Boolean equation POLY AND ACTIVE AREA are reduced by 0.08 μm or 0.23 μm on each side of the gate poly 38 thereby producing the cell 24A, 24B and 24C as shown in FIGS. 4A, 4B, and 4C, respectively, and as more clearly shown in the greatly enlarged portion of FIG. 4C.

The power and ground distribution rails are also desirably modified to avoid so-called rail span collapse and unacceptable transient noise. For example, in a CMOS IC the largest transient burden on the distribution system is when the logic element output is heavily loaded with capacitance and the input has fully switched. In this condition full gate drive is available while the drain to source voltage is still high. The distribution current required to be supported is defined by equation 1 below. The distribution resistance is enumerated in Ω/square (of distribution metalization). The resistance of a fixed width section of a distribution bus is provided in equation 2. Equation 3 relates current switching transients to distribution noise in the form of a ratio between the two IC fabrication processes. Equation 4, which is equation 3 solved for $w_x$, defines the required power or ground distribution metal width $w_x$ for the CMOSX version of the upgraded IC.

$$I_{ds} = k' \cdot \left(\frac{W}{L}\right) \cdot (V_{dd} - V_{t0})^2 \quad (1)$$

$$R_{dist} = \rho \cdot \left(\frac{l}{w}\right) \quad (2)$$

$$\xi = \frac{\Delta V_{dd\_CMOSN}}{\Delta V_{dd\_CMOSX}} = \frac{k'_n \cdot \left(\frac{W_n}{L_n}\right) \cdot (V_{dd\_n} - V_{t0n})^2 \cdot \rho_n \cdot \frac{l_n}{w_n}}{k'_x \cdot \left(\frac{W_x}{L_x}\right) \cdot (V_{dd\_x} - V_{t0x})^2 \cdot \rho_x \cdot \frac{l_x}{w_x}} \quad (3)$$

$$w_x = \frac{\xi \cdot L_n \cdot w_n \cdot k'_x \cdot W_x \cdot (V_{dd\_x} - V_{t0x})^2 \cdot l_x \cdot \rho_x}{k_n \cdot W_n \cdot L_x \cdot l_n \cdot \rho_n \cdot (V_{dd\_n} - V_{t0n})^2} \quad (4)$$

where ξ is the allowable voltage noise ratio between CMOSN and CMOSX (CMOSN noise/CMOSX noise), the subscripts n and x respectively identify CMOSN and CMOSX process parameters, W and L are the MOS channel width and length respectively, k' is the MOS gain factor (using the N channel k' for ground width distributions and the P channel k' for power distribution width determination), l is the length of the distribution metal at a fixed width w, ρ is the sheet resistivity of the distribution metal in Ω/square, $V_{t0}$ is the threshold voltage ($V_{gs}$) of the MOS transistor (above which current is allowed to flow) and $V_{dd}$ is the voltage difference between the positive supply and the negative supply.

Figure 6:
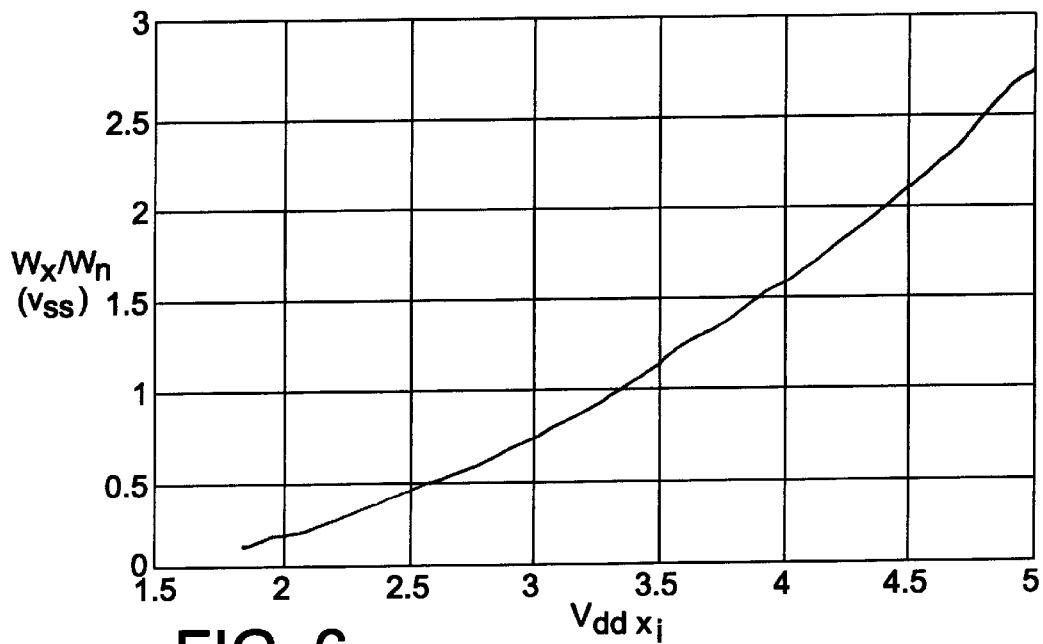
FIG. 6 is a graph of the width ratio for the ground distribution rail used for one example in accordance with the invention.
Figure 7:
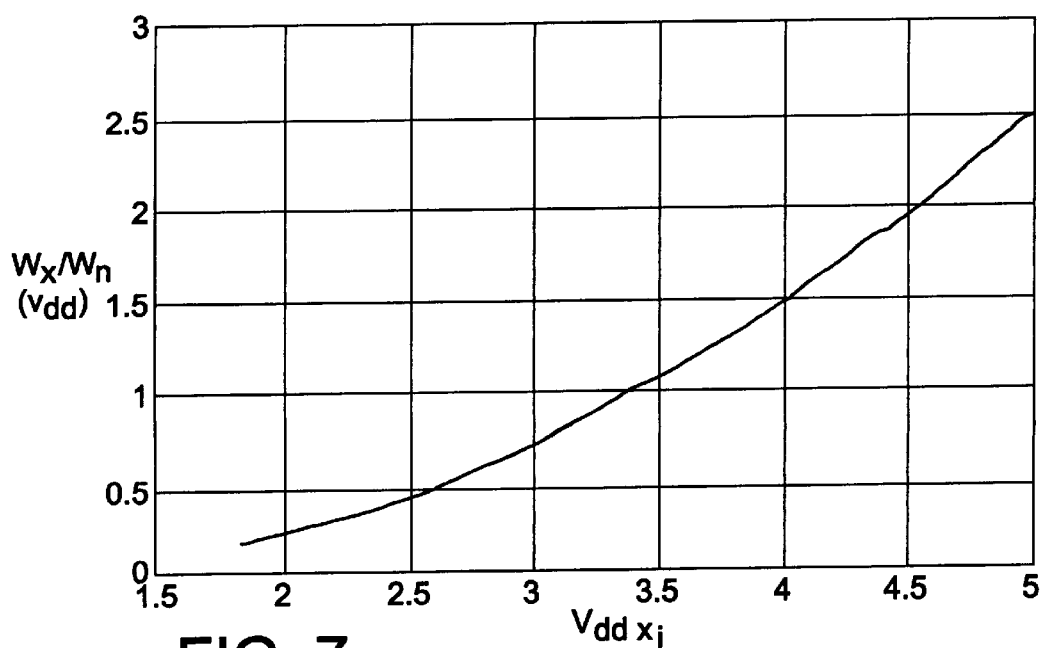
FIG. 7 is a graph of the width ratio for the supply distribution rail used for one example in accordance with the invention.

A plot of Vss (ground) metal ratio ($w_x/w_n$) for a CMOSN part converted to a CMOSX (0.8 μM) part is shown in FIG. 6 for $Vdd_n$=5.0 V and ξ=1. Similarly, FIG. 7 shows the requirements for Vdd distribution. Note that the conversion of a CMOSN part in a 5V application to a CMOSX (0.8 mm) part in a 3.3V application requires no change to either the Vdd (power) or the Vss (ground) distribution width if the allowable noise levels on the distributions in the two cases are identical. If the maximum operating voltage of the converted IC is limited to 3.3V, no power or ground metalization adjustment needs to be made in the conversion process; however, if operation at 5V is required to be maintained, then an adjustment is required as shown in the cell 25A, 25B and 25C of FIGS. 5A, 5B and 5C, respectively.

The ratio $x_x/w_n$ should be inversely applied to the bond inductance. If the metal width needs to increase by 2X, then the number of IC bond wires should increase by 2X for that distribution. Signal bonds do not require increases to multiple bonding, only $V_{dd}$ and $V_{ss}$ bonds are considered for multiple bonding if required by the $w_x/x_n$ ratio.

In other words, for certain conversion, such as where the operating voltage is reduced, no change in the metal width may be required. An additional level of metal may be used for strengthening the power and ground distribution systems as an alternative to increasing the width of the cell distribution buses. The top level metal is usually the thickest metal level and, hence the most desirable for distributing power and ground.

The invention may be further understood by the following description of a conversion from CMOS3 to CMOSX. CMOS3 is a 3 μm CMOS process and cell library. Many products have been developed using this library, however; it is now an obsolete process with fewer and fewer foundries supporting it. Although, specific to a CMOSN to CMOSX conversion, the above FIGS. 1A to 5C may be useful in visualizing the conversion steps for a CMOS3 to CMOSX upgrade. Again the database is loaded onto the CAE platform and saved to a new name. A visual inspection to detect and correct gross errors should be completed. All coordinates in the entire database are multiplied with a scale factor of 0.5.

The contacts and vias used in CMOSX are 0.8 μm×0.8 μm square. After the scale operation, the contacts are 1.5 μm×1.5 μm or 1.5 μm×4 μm depending on the type of contact and the vias are 1.5 μm×1.5 μm. Both the contacts and vias must be shrunken to 0.8 m×0.8 μm. The shrink operation modifies the size, but also maintains the center point. The elongate body tie contact (1.5 μm×4 μm) is converted to two generally square 0.8 μm×0.8 μm contacts which are shorted together with a metal strap.

After the scale operation, the minimum gate polysilicon, which defines the channel length of MOS devices, is 1.5 μm. The minimum gate polysilicon needs to be either 0.8 μm or 0.5 μm, depending on the process variation targeted. In order to accomplish this modification, a Boolean function is used as also described above. In this case, the polysilicon segments that satisfy the Boolean equation Poly AND Active Area are reduced by 0.35 µm or 0.50 µm on each side of the gate poly, depending on the process variation targeted.

Similar considerations for the power and ground distributions need to be included as were discussed above. Equation 4 is still valid, however; the CMOS3 process has different parameters than CMOSN and the resulting adjustments needed for power and ground will be different. In equation 5 $w_3$ refers to the distribution metal width in the CMOS3 cell family, $w_x$ refers to the distribution metal width in the cell converted to CMOSX. Equation 4 is modified to contain CMOS3 parameters and is presented in equation 5:

$$w_x = \frac{\xi \cdot L_3 \cdot w_3 \cdot k_x \cdot W_x \cdot (V_{dd\_X} - V_{t0x})^2 \cdot l_x \cdot \rho_x}{k_3 \cdot W_3 \cdot L_x \cdot l_3 \cdot \rho_3 \cdot (V_{dd\_3} - V_{t03})^2} \quad (5)$$

Figure 8:
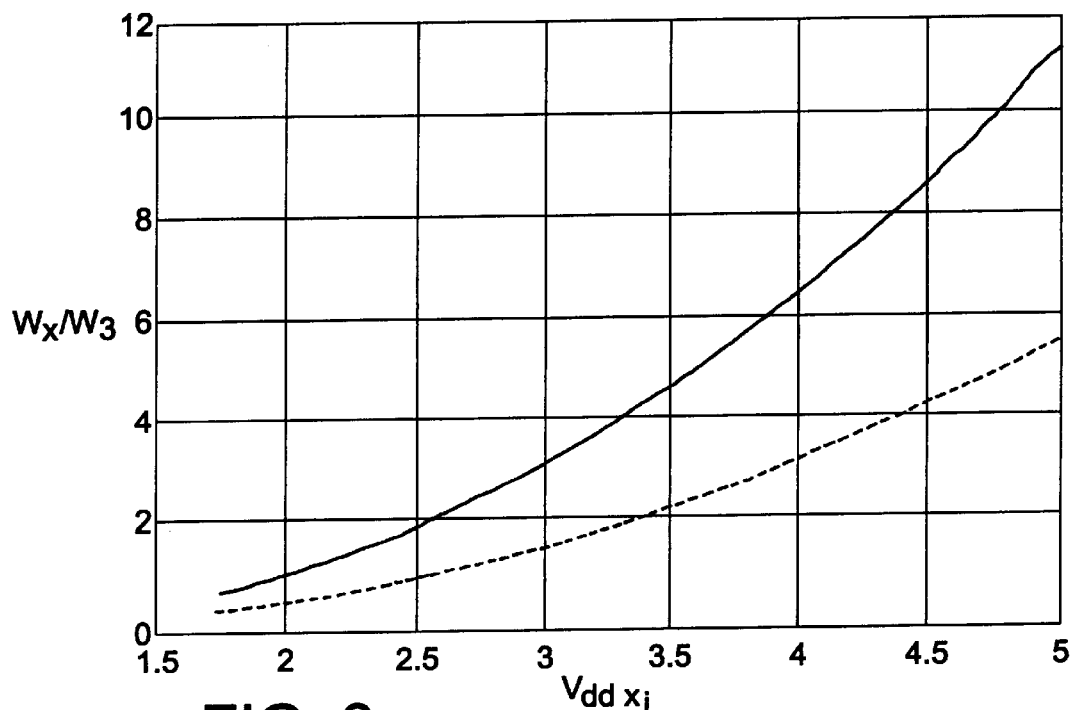
FIG. 8 is a graph of width ratios for the ground distribution rail used for a second example in accordance with the invention.
Figure 9:
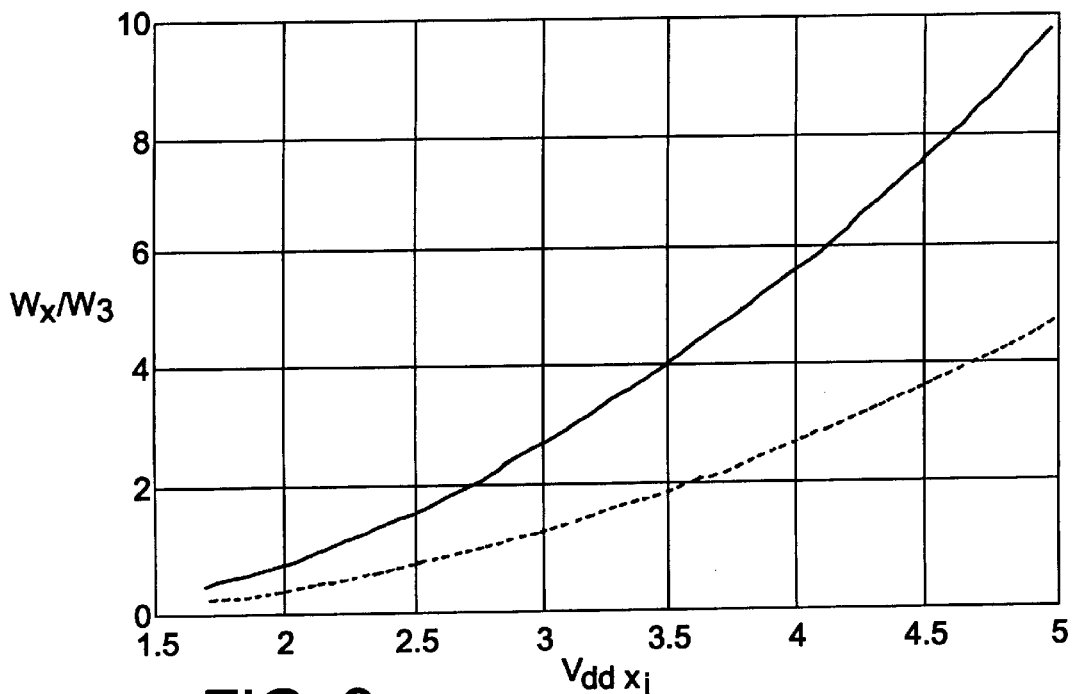
FIG. 9 is a graph of width ratios for the power supply rail used for a second example in accordance with the invention.

As shown in FIG. 8 for the ground rail, ratio$_i$ (solid line) and ratio $a_i$ (dotted line) refer to $w_x/w_3$ for ρ=0.05 and 0.1 Ω/square, respectively. When ρ=0.05 is a specified value; however, the value of ρ for the CMOSN process is 0.15 and 0.25 for the CMOSX process which raises a concern that the ρ of 0.05 for CMOS3 could ever be as low as 0.05 Ω/square. FIG. 9 similarly illustrates the ratios for the supply rail.

The scaling operation reduced the bond pads by 50% on each side. The typical bond pad dimensions are 4 mils×4 mils (100 µm×100 µm). This size is dictated by the mechanical size of the bonding head on the bonding equipment. The bonder requires that the bond wire be mashed to some extent. The bond head must be larger than the bond wire (bond wire is usually 1.25 mil diameter). The bond pad size after the shrinking operation is 2 mils×2 mils (50 µm×50 µm). Some input/output (I/O) pads have I/O cell circuitry wrapped around 3 sides of the cell. The bond pad must be enlarged to 4 mils×4 mils (100 µm×100 µm) without contacting any circuitry in its vicinity. This may require that the bond pad be moved toward the die edge by as much as 2 mils (50 µm).

Electrostatic discharge (ESD) cells from the CMOSX library should be used to replace the CMOS3 ESD cells. ESD protection is strongly influenced by the process resistivities and diffusion depths as would be readily understood by those skilled in the art. Accordingly, even an unmodified ESD cell should not be expected to perform reliably on a process other than its intended process.

The CMOSX cell library test structures and alignment keys should be used instead of those found in the CMOS3 cell library. Process monitoring is most efficient and accurate when identical structures are used for monitoring measurements for different wafer runs. The personnel that operate the exposure and alignment or stepper equipment may typically prefer working with only CMOSX alignment structures.

In both the conversions considered, the performance of the individual cells increased. For this reason the resimulation of previous maximum delays is not a concern. Any non-zero minimum delays required in the pre-conversion IC should be resimulated, after conversion, to insure that the higher performance conversion has not violated any timing constraints as would be readily understood by those skilled in the art. Since, the IC has existed in the past, the input signals from the production test vector set should be used as one simulation input with checks made to insure that the output of the simulation matches the expected test vector output.

One of the objects of the conversion was to produce a manufacturable replacement for an aging IC that is indistinguishable in operation from the previous version of that IC. When this objective is accomplished, other than the possible reduction of the operating voltage, no change is anticipated for any test program or test fixture.

Any time a change is made to an existing component part of a typical system, that part is required to be requalified. This usually requires that the tests, such as salt spray immunity, acceleration and thermal cycling be performed as would be readily understood by those skilled in the art. These are usually one time tests as long as there is no interruption in the manufacture of the part.

Certification should be simplified for mask recovery conversion as described herein, since functions and interconnects remain adjacent to the previously approved version of the IC. The strengths of all drivers (cell outputs) have all changed by a constant ratio so that the results of the SFA performed on the pre-conversion product should not be different in the converted IC. Accordingly, execution of an SFA simulation set is not desired.

The minimum software requirements require an editor that has the ability to read Calma GDSII stream format databases, for example; be able to perform scale, shrink and Boolean operations; and be able to write a fully compliant Calma GDSII stream format output file. Also, the editor must be able to create, copy, place, and interconnect structures, such as input protection networks, and perform design rule checking. Cadence and Mentor offer software suites that fully meet these requirements, for example. However, for certain applications, the software may not be economically desirably due to the infrequent need to perform a mask conversion. Hewlett Packard, for example, offers software under the designation MDS which has many of the capabilities that are needed for the above described purposes (scaling, shrinking, Boolean and Calma GDSII read/write capability) at a lesser price.

Once several mask conversion have been accomplished, the time required to perform an upgrade on a CMOS standard cell IC that converts the mask database from one process to another may take as little as about ten working days. This schedule assumes that the simulation files exist, the mask database is available (in hand), the test vectors are available and machine readable, and N and P channel device models exists for both processes.

The present invention is a process that minimizes the impact of an IC becoming unavailable due to its process being no longer supported by any foundry. The invention makes possible the rapid, low cost and low risk upgrade of aging CMOS cell based Ics. In addition to the examples relating to upgrading an IC cell design, multiple cells or an entire IC design may be upgraded according to the invention. Accordingly, many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A method for converting an original integrated circuit (IC) design for an original manufacturing process to an updated IC design for an updated manufacturing process, the original IC design comprising contacts and at least one power supply rail, the method comprising the steps of:

accessing a database comprising mask data for the original IC design;

performing a first downward size scaling on the mask data to scale down the original IC design;

selectively performing a second downward size scaling on the mask data to further scale down the contacts;

selectively performing a fifth upward size scaling on the mask data to scale up the at least one power supply rail, the step of selectively performing a fifth upward size scaling including the step of determining a scaling factor based on a desired voltage noise ratio between the original process and the updated process; and thereafter storing updated mask data for the updated IC design for the updated manufacturing process.

2. A method according to claim 1 wherein the step of selectively performing the second downward size scaling comprises the steps of displaying and viewing an image of the IC design, and selecting the contacts based on displaying and viewing the image.

3. A method according to claim 1 wherein the mask data of the original IC circuit design identifies contacts; and wherein the step of selectively performing the second downward size scaling comprises the step of selecting the contacts based upon the mask data identifying the contacts.

4. A method according to claim 1 wherein the steps of performing the first downward size scaling and selectively performing the second downward size scaling are each performed in two dimensions.

5. A method according to claim 1 wherein each contact defines a respective center point; and wherein the step of selectively performing the second downward size scaling comprises selectively performing same while maintaining the respective center point of each contact.

6. A method according to claim 1 wherein the step of performing the first downward size scaling comprises performing same by a first factor; and wherein the step of selectively performing the second downward scaling comprises performing same by a second factor different from the first factor.

7. A method according to claim 1 further comprising the steps of displaying and viewing an image of the IC design, and correcting errors determined based on viewing the image.

8. A method according to claim 1 wherein the original IC design comprises vias; and further comprises the step of selectively performing a third downward size scaling on the mask data to further scale down the vias.

9. A method according to claim 8 wherein the step of selectively performing the third downward size scaling comprises the steps of displaying and viewing an image of the IC design, and selecting the vias based on displaying and viewing the image.

10. A method according to claim 1 wherein the original IC design includes at least one elongate contact; and further comprising the step of selectively performing a division of the at least one elongate contact on the mask data into a plurality of generally square contacts.

11. A method according to claim 10 wherein the step of selectively performing the division comprises the steps of displaying and viewing an image of the IC design, and selecting the at least one elongate contact based on displaying and viewing the image.

12. A method according to claim 10 further comprising the step of selectively adding a connector to the mask data to connect the plurality of generally square contacts.

13. A method according to claim 1 wherein the original IC design includes at least one polysilicon gate for a respective MOS device; and further comprising the step of selectively performing a fourth downward size scaling on the mask data in at least one dimension to further scale down a size of the at least one polysilicon gate.

14. A method according to claim 13 wherein the mask data of the original IC design identifies active areas and polysilicon areas; and wherein the step of selectively performing the fourth downward size scaling comprises selecting the at least one polysilicon gate based upon the mask data identifying at least one area that is both an active area and a polysilicon area.

15. A method according to claim 1 further comprising the step of running simulations for circuit delays.

16. A method according to claim 1 wherein the step of selectively performing the fifth upward scaling comprises the steps of displaying and viewing an image of the IC design, and selecting the at least one power supply rail based on displaying and viewing the image.

17. A method according to claim 1 wherein the original IC design comprises original electrostatic discharge (ESD) protection, and further comprising the step of substituting new ESD protection for the original ESD protection.

18. A method according to claim 1 wherein the step of determining a scaling factor includes:

determining a desired width upward scaling factor based on a desired voltage noise ratio between the original process and the updated process; and the method further comprising the step of:

selectively adding at least one additional parallel supply rail based upon determining that the desired width upward scaling factor is greater than about two.

19. A method according to claim 1 wherein the original IC comprises bond pads; and further comprising the step of selectively performing a sixth upward size scaling on the mask data to scale up the bond pads.

20. A method according to claim 19 wherein the step of selectively performing the sixth upward scaling comprises the steps of displaying and viewing an image of the IC design, and selecting the bond pads based on displaying and viewing the image.

21. A method according to claim 19 wherein the step of selectively performing a sixth upward size scaling comprises the steps of performing same while avoiding intrusion into adjacent circuit portions.

22. A method according to claim 1 wherein the original IC design comprises original test structures and alignment keys; and further comprising the step of substituting new test structures and alignment keys for the original test structures and alignment keys.

23. A method for converting an original integrated circuit (IC) design for an original manufacturing process to an updated IC design for an updated manufacturing process, the original IC design comprising vias and at least one power supply rail, the method comprising the steps of:

accessing a database comprising mask data for the original IC design;

performing a first downward size scaling on the mask data to scale down the original IC design;

selectively performing a third downward size scaling on the mask data to further scale down the vias;

selectively performing a fifth upward size scaling on the mask data to scale up the at least one power supply rail, the step of selectively performing a fifth upward size scaling including the step of determining a scaling factor based on a desired voltage noise ratio between the original process and the updated process; and thereafter storing updated mask data for the updated IC design for the updated manufacturing process.

24. A method according to claim 23 further comprising the step of running simulations for circuit delays.

25. A method according to claim 23 wherein the original IC design comprises original electrostatic discharge (ESD) protection, and further comprising the step of substituting new ESD protection for the original ESD protection.

26. A method according to claim 23 wherein the step of selectively performing the third downward size scaling comprises the steps of displaying and viewing an image of the IC design, and selecting the vias based on displaying and viewing the image.

27. A method according to claim 23 wherein the steps of performing the first downward size scaling and selectively performing the third downward size scaling are each performed in two dimensions.

28. A method according to claim 23 wherein each via defines a respective center point; and wherein the step of selectively performing the third downward size scaling comprises selectively performing same while maintaining the respective center point of each via.

29. A method according to claim 23 wherein the step of performing the first downward size scaling comprises performing same by a first factor; and wherein the step of selectively performing the third downward scaling comprises performing same by a third factor different from the first factor.

30. A method according to claim 23 further comprising the steps of displaying and viewing an image of the IC design, and correcting errors determined based on viewing the image.

31. A method according to claim 23 wherein the original IC design comprises original test structures and alignment keys; and further comprising the step of substituting new test structures and alignment keys for the original test structures and alignment keys.

32. A method for converting an original integrated circuit (IC) design for an original manufacturing process to an updated IC design for an updated manufacturing process, the original IC design comprising at least one polysilicon gate for a respective MOS device and at least one power supply rail, the method comprising the steps of:

accessing a database comprising mask data for the original IC design;

performing a first downward size scaling on the mask data to scale down the original IC design;

selectively performing a fourth downward size scaling on the mask data to further scale down a size of the at least one polysilicon gate;

selectively performing a fifth upward size scaling on the mask data to scale up the at least one power supply rail, the step of selectively performing a fifth upward size scaling including the step of determining a scaling factor based on a desired voltage noise ratio between the original process and the updated process; and thereafter storing updated mask data for the updated IC design for the updated manufacturing process.

33. A method according to claim 32 further comprising the step of running simulations for circuit delays.

34. A method according to claim 32 wherein the original IC design comprises original electrostatic discharge (ESD) protection, and further comprising the step of substituting new ESD protection for the original ESD protection.

35. A method according to claim 32 wherein the mask data of the original IC circuit design identifies active areas and polysilicon areas; and wherein the step of selectively performing the fourth downward size scaling comprises selecting the at least one polysilicon gate based upon the mask data identifying at least one area that is both an active area and a polysilicon area.

36. A method according to claim 32 wherein the step of performing the first downward size scaling is performed in two dimensions; and wherein the step of selectively performing the fourth downward size scaling is each performed in at least one dimension.

37. A method according to claim 32 wherein the step of performing the first downward size scaling comprises performing same by a first factor; and wherein the step of selectively performing the fourth downward scaling comprises performing same by a fourth factor different from the first factor.

38. A method according to claim 32 further comprising the steps of displaying and viewing an image of the IC design, and correcting errors determined based on viewing the image.

39. A method according to claim 32 wherein the original IC design comprises original test structures and alignment keys; and further comprising the step of substituting new test structures and alignment keys for the original test structures and alignment keys.

40. A method for converting an original integrated circuit (IC) design for an original manufacturing process to an updated IC design for an updated manufacturing process, the original IC design comprising at least one power supply rail, the method comprising the steps of:

accessing a database comprising mask data for the original IC design;

performing a first downward size scaling on the mask data to scale down the original IC design;

selectively performing a fifth upward size scaling on the mask data to scale up the at least one power supply rail, the step of selectively performing a fifth upward size scaling including the step of determining a scaling factor based on a desired voltage noise ratio between the original process and the updated process; and thereafter storing updated mask data for the updated IC design for the updated manufacturing process.

41. A method according to claim 40 further comprising the step of running simulations for circuit delays.

42. A method according to claim 40 wherein the original IC design comprises original electrostatic discharge (ESD) protection, and further comprising the step of substituting new ESD protection for the original ESD protection.

43. A method according to claim 40 wherein the step of selectively performing the fifth upward scaling comprises the steps of displaying and viewing an image of the IC design, and selecting the at least one power supply rail based on displaying and viewing the image.

44. A method according to claim 40 wherein the original IC design comprises original test structures and alignment keys; and further comprising the step of substituting new test structures and alignment keys for the original test structures and alignment keys.

45. A method according to claim 40 wherein the step of determining a scaling factor includes determining a desired width upward scaling factor based on a desired voltage noise ratio between the original process and the updated process; and the method further comprising the step selectively adding at least one additional parallel supply rail based upon determining that the desired width upward scaling factor is greater than about two.

46. A method according to claim 40 wherein the step of performing the first downward size scaling is performed in two dimensions; and wherein the step of selectively performing the fifth upward size scaling is each performed in at least one dimension.

47. A method according to claim 40 further comprising the steps of displaying and viewing an image of the IC design, and correcting errors determined based on viewing the image.

48. A method for converting an original integrated circuit (IC) design for an original manufacturing process to an updated IC design for an updated manufacturing process, the original IC design comprising bond pads and at least one power supply rail, the method comprising the steps of:

accessing a database comprising mask data for the original IC design;

performing a first downward size scaling on the mask data to scale down the original IC design;

selectively performing a fifth upward size scaling on the mask data to scale up the at least one power supply rail, the step of selectively performing a fifth upward size scaling including the step of determining a scaling factor based on a desired voltage noise ratio between the original process and the updated process;

selectively performing a sixth upward size scaling on the mask data to scale up the bond pads; and thereafter storing updated mask data for the updated IC design for the updated manufacturing process.

49. A method according to claim 48 further comprising the step of running simulations for circuit delays.

50. A method according to claim 48 wherein the original IC design comprises original electrostatic discharge (ESD) protection, and further comprising the step of substituting new ESD protection for the original ESD protection.

51. A method according to claim 48 wherein the original IC design comprises original test structures and alignment keys; and further comprising the step of substituting new test structures and alignment keys for the original test structures and alignment keys.

52. A method according to claim 48 wherein the step of selectively performing the sixth upward scaling comprises the steps of displaying and viewing an image of the IC design, and selecting the bond pads based on displaying and viewing the image.

53. A method according to claim 48 wherein the step of selectively performing the sixth upward size scaling comprises the step of performing same while avoiding intrusion onto adjacent circuit portions.

54. A method according to claim 48 wherein the step of performing the first downward size scaling is performed in two dimensions; and wherein the step of selectively performing the sixth upward size scaling is performed in two dimensions.

55. A method according to claim 48 further comprising the steps of displaying and viewing an image of the IC design, and correcting errors determined based on viewing the image.

* * * * *